United States Patent [19]

Fritz

[11] Patent Number: 5,084,095
[45] Date of Patent: Jan. 28, 1992

[54] COATING FOR PRINTED SUBSTRATE
[75] Inventor: Thomas M. Fritz, Shippensburg, Pa.
[73] Assignee: Beidel Printing House, Inc., Shippensburg, Pa.
[21] Appl. No.: 628,568
[22] Filed: Dec. 17, 1990
[51] Int. Cl.$^5$ .................................. C09K 3/18
[52] U.S. Cl. ........................... 106/2; 106/30; 106/218; 101/491
[58] Field of Search ............. 106/5, 2, 20, 32
[56] References Cited
U.S. PATENT DOCUMENTS 2,412,592 12/1946 Maier .................. 427/411
4,218,294 8/1980 Brack ................... 427/54.1
4,775,558 10/1988 Haas et al. ............. 427/373
4,883,534 11/1989 Sandham et al. ......... 106/15.05

Primary Examiner—William R. Dixon, Jr.
Assistant Examiner—Margaret V. Einsmann
Attorney, Agent, or Firm—Michael J. Kline; Lewis F. Gould, Jr.

[57] ABSTRACT

A non-aqueous coating for use on printable substrates is disclosed. A polyurethane/varnish coating is used to impart improved gloss and abrasion resistance to the printed substrate. The non-aqueous coating, furthermore, imparts waterproofing and color enrichment properties to the substrate.

9 Claims, 2 Drawing Sheets

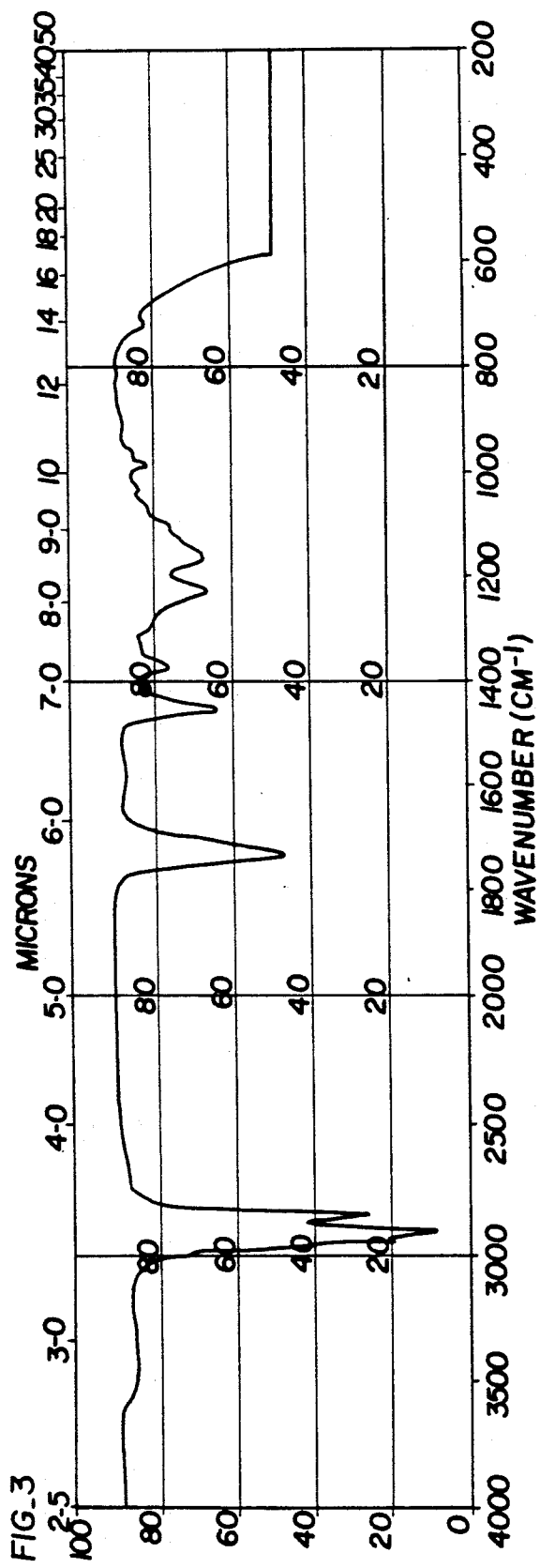
FIG_3
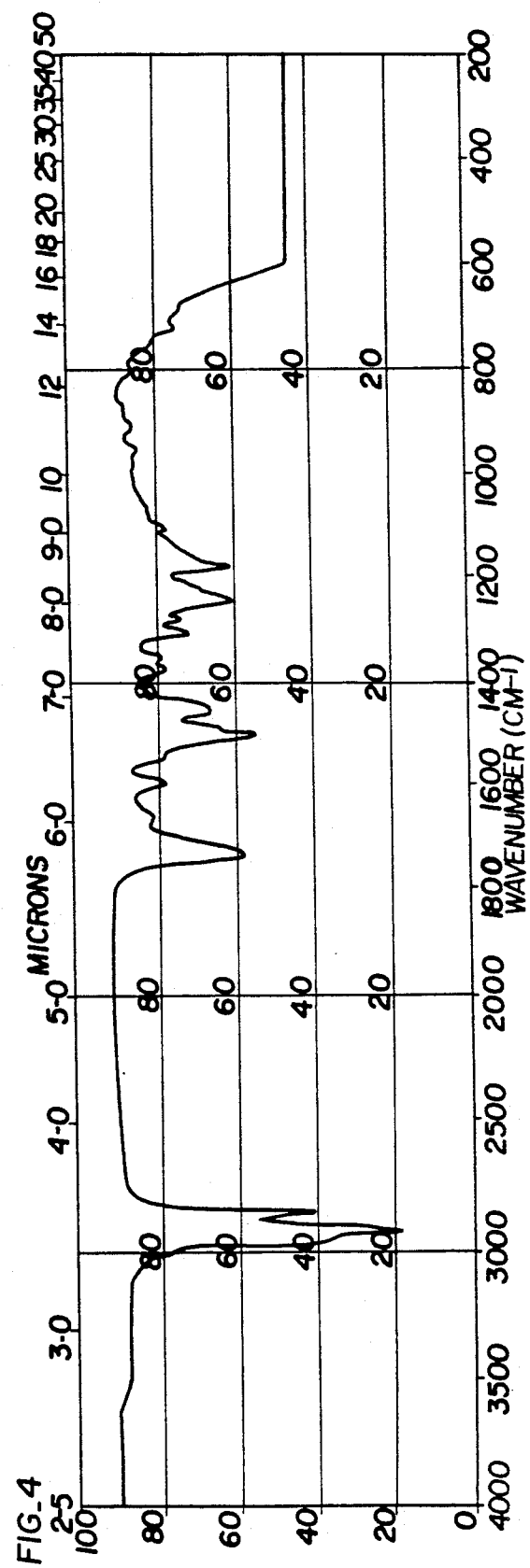
FIG_4

COATING FOR PRINTED SUBSTRATE

FIELD OF THE INVENTION

The present invention relates to coatings applied to printed substrates and in particular coatings comprised of polyurethane and varnish applied directly to a printed sheet and/or to inks containing polyurethane used in printing.

BACKGROUND OF THE INVENTION

A coating is a clear over-print applied to a press sheet to improve the overall glossiness and provide abrasion resistance to the printed image. Today's printing industry demands high gloss, high abrasion resistant coatings, for example as dust jackets for books, for advertising brochures, and food packaging.

Coatings are applied in-line on-press as an extra press unit, off-line on coating or varnishing machines, or in-line followed by off-line to achieve the greatest effect. Coatings can be applied locally to selected image areas with conventional offset lithographic techniques on-press, or with blanket cut-outs on coating machines. Coatings may also be applied over the entire sheet with offset blankets either on-press or on a coating machine.

The term "varnishing" is still used to define in-line coating using printing units to apply a coating to a localized area. Occasionally, the term is also used to differentiate creative, special-effect coating from production coating. Varnishing originally referred to coating with a boiled linseed oil varnish, applied on-press as if the varnish were a clear ink. Although varnish increased gloss and rub-resistance to an extent, anti-setoff powder used in printing decreased the gloss and rub-resistance. In some cases, varnish actually decreased gloss.

In general, there are two types of coatings presently used by the printing industry, so called "aqueous" and "UV" coatings, neither of which has proven wholly satisfactory. However, aqueous (acrylic) and ultraviolet (UV) coatings have over the years come to replace varnish as the primary coating mediums for over-printing.

An aqueous (acrylic) coating is a water-soluble, thermoplastic polymer coating that requires heat and air to dry or harden the coating. Aqueous coatings are 60% solvent (water and alcohol) much of which escapes in the coating and drying process, along with some of the gloss. Once applied and dried under infrared heat, aqueous coatings harden instantly, but because they are thermoplastics they can be softened with reapplication of heat.

A UV coating is a monomer coating that requires ultraviolet energy to dry or harden the coating. UV coatings have a photo-initiator which start the ultraviolet hardening process. UV coatings are solventless, which means that once applied and dried under ultraviolet energy UV coatings harden instantly and are not susceptible to softening.

Although aqueous and UV coatings have improved the level of gloss and abrasion resistance over previously used coatings, acrylic and UV coatings are not without problems. For example, aqueous coatings will not adhere to a previous UV coating. Also aqueous coatings are less glossy and less rub-resistant than UV coatings. Aqueous coatings have a tendency to "reactivate" on the sheet, for example, when stored in a warm warehouse, which can cause the sheets to stick together and ruin the job.

UV coatings are more expensive than aqueous coatings, requiring special expensive equipment and ultraviolet lights, which require workers to wear protective clothing and goggles. UV coatings have a tendency to crack when a printed sheet is folded, and cannot be printed over once applied to a substrate. Also, UV coatings typically require special catalysts and other additives to impart an acceptable coating.

In general, the prior art coatings are not especially useful in many different applications for which coatings are required, such as hot- and cold-food packaging. Often, coatings of the prior art exhibit low gloss, poor scratch resistance, poor waterproofing, heat and cold sensitivity, and adherence problems relative to the substrate. Frequently the coatings of the prior art do not significantly minimize the tendency for ink colors to fade. Also, these prior art coatings do little to improve the otherwise dull colors of ink printed on recycled paper.

Accordingly, it would be useful to develop a coating for printed substrates that eliminated or reduced most or all of the above-noted problems experienced with the prior art coatings.

It is an object of the present invention to provide a non-aqueous coating that is waterproof and highly abrasion resistant.

It is a further object of the present invention to provide a coating that imparts improved gloss to a substrate.

It is yet another object of the present invention to provide a coating which protects against fading of colors over which the coating is applied.

It is another object of the present invention to provide a coating which is insensitive to hot and cold temperature extremes.

It is still another object of the present invention to provide a coating which brightens ink or other pigments over which the coating is applied.

It is a further object of the present invention to allow coating and/or printing over surfaces which normally cannot be adhered to.

It is another object of the present invention to provide a coating which is quick-drying.

SUMMARY OF THE INVENTION

According to the present invention, it has unexpectedly been found that a coating for printed and other substrates comprising a mixture of polyurethane and a clear-coat varnish, without any catalysts or additives, produces a waterproof coating that is stable in both hot and cold environments, and imparts greater scratch resistance and gloss relative to prior art coatings. The coating dries relatively rapidly and produces improved color enhancement and fade resistance relative to prior art coatings.

In a preferred embodiment of the invention, polyurethane and clear-coat varnish are present in a weight ratio of about 1:16 to 1:10 and most preferably about 1:12. Because the coating is non-aqueous, it imparts waterproof properties that are not available from the aqueous coatings. The coating does not, however, require the expensive ultraviolet equipment required for the UV coatings.

In another embodiment of the invention polyurethane is mixed directly with the oil-based ink, imparting improved properties to the ink.

In yet another embodiment of the invention, a coating of polyurethane/varnish is applied to the printed substrate printed with the polyurethane/ink composition.

BRIEF DESCRIPTION OF THE FIGURES

FIG. 3 illustrates an infrared spectrograph for varnish with polyurethane according to a preferred embodiment of the present invention.

FIG. 4 illustrates an infrared spectrograph of process yellow ink with polyurethane according to a preferred embodiment of the present invention.

DETAILED DESCRIPTION OF THE INVENTION

Figure 1:
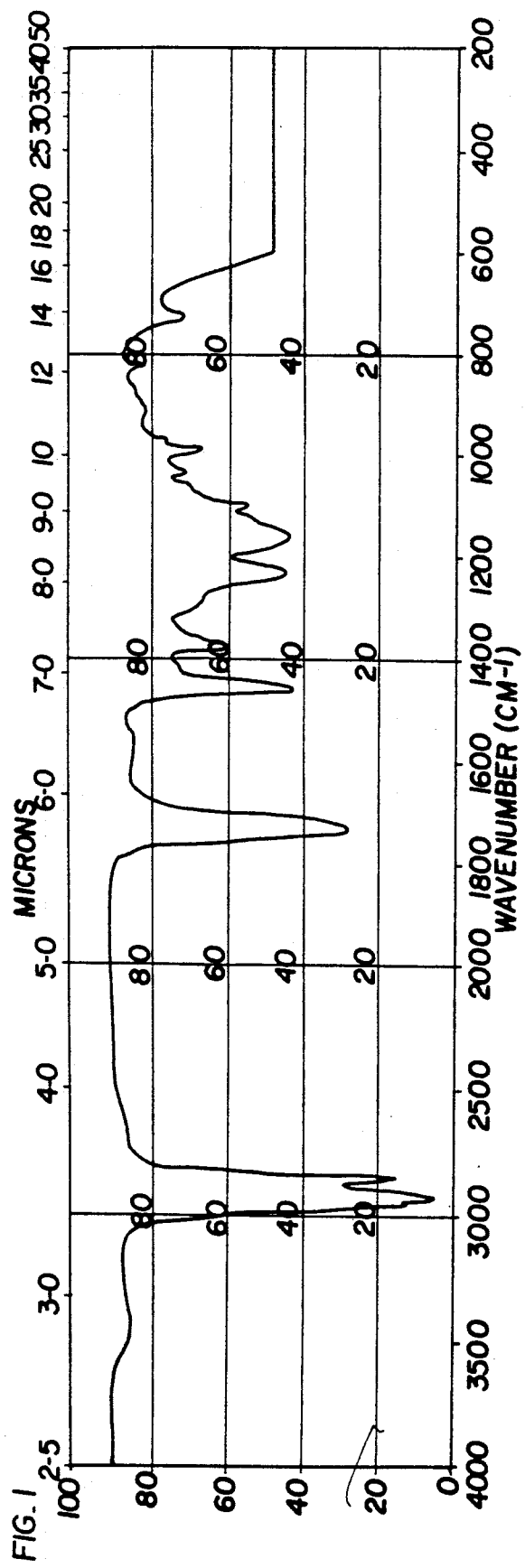
FIG. 1 illustrates an infrared spectrograph for varnish alone.

The present invention comprises a non-aqueous composition for use as a waterproof coating, which is stable in both hot and cold environments. Preferably, the composition comprises a mixture of a polyurethane and a clear-coat varnish. As used herein, the term "polyurethane" refers to any of the various polymeric materials known as polyurethane. By way of example, but not limitation, a polyurethane material that has been used with success in the present invention comprises a product by the name of ZAR®GLOSS, manufactured by United Gilsonite Laboratories, of Scranton, Pa. Another suitable polyurethane is manufactured by Minwax, of Montvale, N.J., and is sold as clear gloss polyurethane.

The ZAR®GLOSS product comprises approximately 45% by weight mineral spirits and 50% by weight modified polyurethane resin, and less than about 5% kerosene.

It is, of course, contemplated to be within the scope of the invention that it would be possible to mix polyurethane resin directly with the varnish, in other polyurethane mixtures, either with or without a mineral spirit carrier, as would be appreciated by those skilled in the art.

As used herein, the term "varnish" refers to any oleoresinous varnish that may be used in the printing industry. Varnishes suitable for coatings are known, and include, for example, those described in U.S. Pat. No. 2,412,592, incorporated by reference herein. "Clear coat varnish" is a well-known term used and understood by those skilled in the printing industry. By way of example, but not limitation, a varnish that has proven useful in connection with the present invention includes that known by the name ALGLOSS OVERVARNISH, product code P017, manufactured by Algan, Inc. of Chagrin Falls, Ohio. Also, overprint varnish sold by Cal, Inc. of Denver, Colo. has proven effective in compositions of the present invention.

In a preferred embodiment of the invention, approximately one part of polyurethane, by weight, is mixed with approximately 10 to 16 parts of varnish by weight to produce a non-aqueous coating which may be applied directly to the inked sheet. Most preferably, one part by weight polyurethane to twelve parts by weight varnish is used. If the ratio of varnish to polyurethane goes much below 10, the polyurethane tends to form a layer which interferes with providing an acceptable coating. If the ratio goes much above 16, the improved results of the present invention becomes less pronounced.

Surprisingly, it has been found that when this coating is applied and dried, the resulting coated substrate exhibits superior gloss, abrasion resistance, color enhancement and fade resistance relative to prior art coatings.

The use of polyurethane generally in connection with coatings is not new. Hille, et al. U.S. Pat. No. 4,496,675 discloses an aqueous dispersion based on a polyurethane synthetic resin. This dispersion includes a hydrolyzed shellac as a second binder component. However, this coating is aqueous, and must be manufactured by hydrolyzing the shellac, by heating the composition in water in the presence of bases to prepare the aqueous solution. Such a coating would not hold up to the waterproof requirements of the present invention. Haas et al., U.S. Pat. No. 4,775,558, discloses polyurethanes combined with other materials, such as linseed oil. However, the art has failed to recognize the unexpectedly superior coating properties achieved using the critical limitations taught by the present invention, wherein only 1 part by weight polyurethane is used with 10 to 16, and most preferably 12, parts by weight of varnish as a waterproof coating composition exhibiting high gloss and scratch resistance.

EXAMPLE 1

A coating of the present invention was prepared by thoroughly mixing one part ZAR®GLOSS polyurethane by weight with 12 parts by weight of ALGLOSS OVERVARNISH. A light reflection test was conducted using paper substrate printed with dense black ink. The same ink batch was used for all test pieces, and the light reflectivity test was conducted according to industry accepted practice, which includes illuminating the test piece at a 60° angle and measuring the amount of light reflected from the test piece using a gloss meter. In each case, the coating applied to the test piece was allowed to dry before testing.

Table I below discloses the comparative light reflection results of uncoated paper (Sample A) a coating of the prior art (varnish only, Sample B) and the coating of the present invention (Sample C). As illustrated, the coating of the present invention provides far superior light reflective properties than either the uncoated or varnished surfaces. This is particularly surprising, in view of the fact that only about 8% (wt.) of the Sample C composition by weight comprised polyurethane (only 4% on polyurethane solids basis), yet Sample C exhibited over 58% better gloss than the varnish coating alone, Sample B.

TABLE I

| Light Reflection Test - Polyurethane/Varnish Coating | | |
|---|---|---|
| Sample | | % Light Reflected |
| A | Dense Black Only | 48.5% |
| B | Dense Black With Varnish | 48.9% |
| C | Dense Black With Polyurethane/Varnish | 77.5% |

It has been found that the coating of the present invention produces a high-gloss coating which dries in approximately 2½ hours, requiring no heated dryers. However, if heated driers are used, it would be possible to apply a thicker coating, resulting in even higher gloss. The coating produced is scratch resistant, and requires no special coater or tower-type baking oven. The coating can be run on a small duplicator offset press, a large offset press or a letter press.

The coating of the invention is applied in the same manner as ink except the entire surface is coated. No special mixing is required, but the polyurethane and varnish should be thoroughly mixed prior to application.

The coating of the present invention protects against ultraviolet rays, enriches colors of printed materials, bonds to surfaces that normally cannot be over-printed, such as UV coatings and brightens ink on recycled paper. Significantly, the coating of the present invention imparts waterproof properties to the substrate, an important consideration for food packaging. Additionally, the coating on the present invention has been found not to be affected by heat or cold.

EXAMPLE 2

A sunlight test was used to determine the present invention's ability to prevent ultraviolet fading. The test pieces were printed with a yellow-green ink, which has a high tendency to fade, and set in a sunny window for approximately three weeks. Each of the test pieces was partially covered to provide a control color for comparison. The three test pieces included an uncoated sheet, a sheet coated with a UV coating, and a sheet coated with a coating of polyurethane/varnish as described in Example 1. Upon inspection at the conclusion of the test, the uncoated sheet experienced almost complete color loss, while the UV coated sheet exhibited some fading, as clearly indicated by a strong contrast line separating the exposed and unexposed portions of the sheet. The sample coated with the polyurethane/varnish coating of the present invention exhibited the least amount of fading, as the line separating the exposed surfaces from the unexposed surfaces was barely discernible.

EXAMPLE 3

Cardstock used for food packaging was coated with the polyurethane/varnish coating of Example 1 and placed in a freezer for 7 weeks. No frost penetration or water damage to the underlying substrate was visible after this time period. When this type of coated sheet is placed under running tap water, no water penetration to the substrate occurs, and water rolls quickly off the surface.

Figure 2:
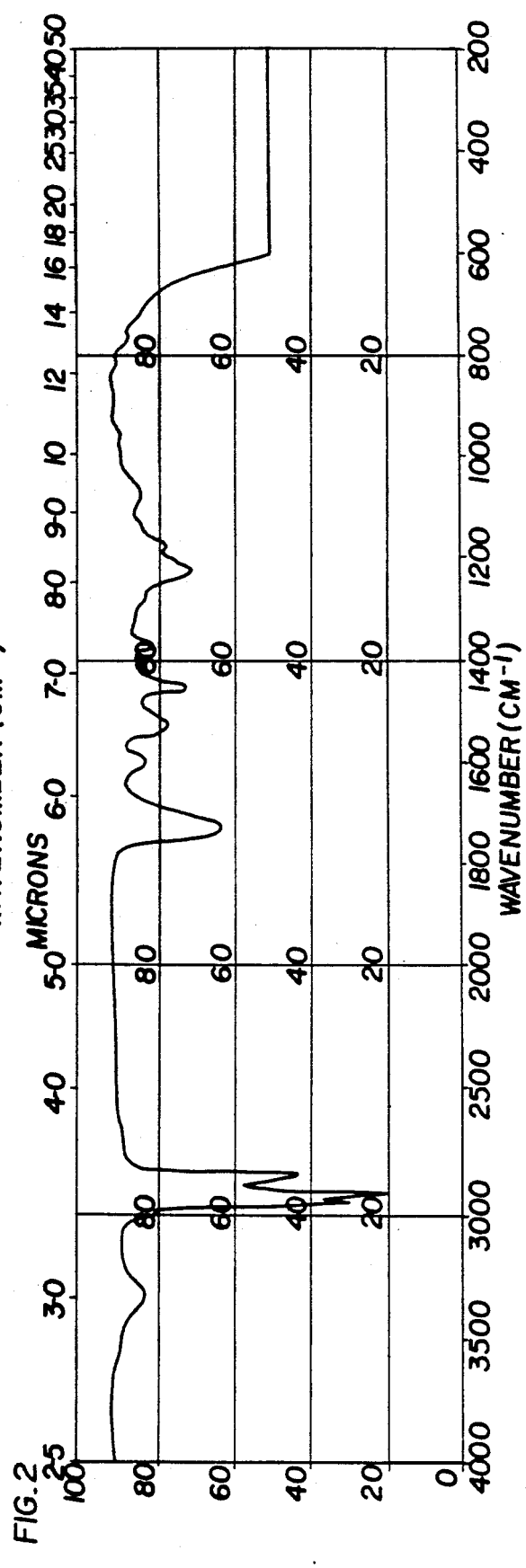
FIG. 2 illustrates an infrared spectrograph for polyurethane alone.

Although the precise mechanism whereby the polyurethane and varnish when used in the preferred ratios interact is not precisely understood, is believed that the polyurethane and varnish combined chemically in some way producing a coating yielding the superior properties of the present invention. An IR spectrum has been run on the coating of the present invention, indicating that the combined polyurethane and varnish comprise a product which is different from the polyurethane and varnish individually. See FIGS. 1-4.

In another embodiment of the invention polyurethane is added directly to an oil-based ink. It has unexpectedly been found that by adding the polyurethane to the ink in this way the ink adheres to a previously coated job. The polyurethane also acts as a tack reducer, and enables reds, blues and violets to withstand heat application without reactivation (fading). The polyurethane in turn brightens the ink pigment and imparts higher gloss to the finished print. Furthermore, it has been found that the ink dries harder and more quickly. Also, the polyurethane and ink mixture produces a smoother solid with less ink and protects against fading.

EXAMPLE 4

The same polyurethane/varnish coating as used in Example 1 was employed, except in this example, one part of polyurethane per 10 parts of oil-based dense black ink, by weight, (from the same ink batch used in Example 1) was used. Three test pieces were run, Sample D, which was the polyurethane/ink alone, Sample E, which was the polyurethane/ink overcoated with varnish only, and Sample F, which was the polyurethane/ink overcoated with the polyurethane/varnish coating of Example 1. The results are shown in Table II, which shows that the polyurethane, when added to the ink, increases reflectivity slightly over the ink without polyurethane shown in Sample A of Table I. Also as shown in Table II, when the test piece was varnished, (Sample E) reflectivity actually dropped, but was improved significantly (35.8%) by overcoating with the polyurethane/varnish coating of the present invention (Sample F).

It has been found that when the ink contains polyurethane, it is possible to print on substrates that will not normally accept ink.

TABLE II

| Light Reflectivity Test - Polyurethane in Ink | | |
|---|---|---|
| Sample | | % Light Reflected |
| D | Dense Black Only | 50.4% |
| E | Dense Black With Varnish | 49.2% |
| F | Dense Black With Polyurethane/Varnish | 66.8% |

EXAMPLE 5

A sheet of paper having a UV coating was printed with the same type of ink as described in Sample F of Example 4 above. The ink remained on the surface, and after drying, adhered to the surface and could not be rubbed off. The same UV coated paper was printed with a standard ink, that is, not containing polyurethane, and was allowed to dry. The resulting ink smeared off the sheet when dry with little hand pressure.

In a preferred method of practicing the present invention the ink to which polyurethane has been added, preferably in quantities of one part polyurethane per ten parts ink, by weight, is printed on a substrate, followed by the application of a polyurethane/varnish coating (of the type described in Example 1). After the coating is applied, the printed substrate is allowed to cure in conventional manner, for example by air-drying or through heated drying if desired. However, it has been surprisingly found that drying times for the present invention have been reduced from typically 24-48 hours to only 2-2½ hours.

The coatings of the present invention are useful on a variety of printable substrates including paper, cardboard, liner-board, card-stock, wood, metal, mineral substrates, plastics, cellophane and foil.

EXAMPLE 6

A Southerland Rubber Tester was used to test the abrasion resistance of the coatings of the present invention. A coating similar to that described in Example 1 was applied to various substrates under various conditions as set forth in Table III, indicating extremely good abrasion resistance.

TABLE III

| Substrate | Pound Test | No. Strokes | Abrasion |
| --- | --- | --- | --- |
| 100# Gloss Enamel | 2 | 100 | No Visible Scuff Marks |
| 100# Gloss Enamel | 4 | 80 | Visible Scuff Marks |
| 10 Pt. Coated Board Stock | 2 | 50 | Very Light Scuff Marks |
| 10 Pt. Coated Board Stock | 4 | 50 | Light Scuff Marks |
| Cambell Board Stock | 4 | 40 | Visible Scuff Marks |
| Poly Board Stock | 4 | 40 | Visible Scuff Marks |
| 1266 Board Stock | 4 | 40 | Visible Scuff Marks |
| 1061 Board Stock | 4 | 40 | Visible Scuff Marks |
| Recycled Board | 4 | 40 | Visible Scuff Marks |

It is preferred in practicing the present invention that oil-based inks be used, taking advantage of the non-aqueous nature of the coating.

Optionally, following the curing of the coating used according to the present invention, it is possible to coat the printed substrate with a UV coating, using conventional methods.

I claim:

1. A non-aqueous composition for use as a waterproof coating for a printable substrate, said composition comprising a mixture of polyurethane and an oleoresinous varnish in a weight ratio of about 1:16 to about 1:10.

2. The composition of claim 1 wherein said polyurethane and oleoresinous varnish are present in a weight ratio of about 1:12.

3. A process for coating on a printable substrate comprising the steps of:
   a. printing on said printable substrate with a printing ink;
   b. printing on said printed substrate with a non-aqueous coating comprising about one part polyurethane by weight and about 10–16 parts oleoresinous varnish by weight;
   c. curing said coated printed substrate to allow said coating to harden.

4. The process of claim 3 wherein said printable substrate is selected from the group consisting of paper, cardboard, liner board, card stock, wood, metal, mineral substrates, plastics, and cellophane.

5. The process of claim 3 wherein said coating comprises polyurethane and said oleoresinous varnish in a weight ratio of about 1:12.

6. The process of claim 4 wherein said ink includes polyurethane being present in a weight ratio of about 1:10 with respect to said ink.

7. The process of claim 4 wherein said ink is oil-based.

8. A non-aqueous composition for use as a waterproof coating for printed substrates, said composition comprising a mixture of oleoresinous varnish and no greater than about 5% by weight polyurethane resin, said coating imparting color enrichment to said printed substrate relative to a printed substrate having only a varnish coating, said waterproof coating further imparting at least 35% higher gloss to said substrate relative to a printed substrate having only a varnish coating.

9. An ink composition consisting essentially of a mixture of an oil based ink and polyurethane in a weight ratio of about 10 parts ink to 1 part polyurethane.

* * * * *

UNITED STATES PATENT AND TRADEMARK OFFICE
CERTIFICATE OF CORRECTION

PATENT NO. : 5,084,095
DATED : January 28, 1992
INVENTOR(S) : Thomas M. Fritz

It is certified that error appears in the above-indentified patent and that said Letters Patent is hereby corrected as shown below:

Title page, item [56], under U.S. PATENT DOCUMENTS, add:

| | | | |
|---|---|---|---|
| 4,496,675 | 1/1985 | Hille et al. | 524/77 |
| 3,992,316 | 11/1976 | Pedain et al. | 424/77 |
| 4,240,939 | 12/1980 | Kostic | 106/6 |
| 3,215,655 | 11/1965 | Clancy et al. | 524/77 |
| 3,350,329 | 11/1967 | Scholl | 524/25 |

FOREIGN PATENT DOCUMENTS 89,154,523   5/1987   Hakuto

OTHER PRIOR ART

Utilizing Aqueous Inks and Coatings - May/June 1990; By Cliff Frazier.

The Outlook for Ink - September 1988; by Theodore Lustig.

UNITED STATES PATENT AND TRADEMARK OFFICE
CERTIFICATE OF CORRECTION

PATENT NO. : 5,084,095

DATED : January 28, 1992

INVENTOR(S) : Thomas M. Fritz

It is certified that error appears in the above-identified patent and that said Letters Patent is hereby corrected as shown below:

Column 8, line 18, "claim 4" should read --claim 3--.

Column 8, line 21, "claim 4" should read --claim 3--.

Signed and Sealed this

Fourth Day of January, 1994

*Attest:*

BRUCE LEHMAN

*Attesting Officer*  *Commissioner of Patents and Trademarks*